(12) United States Patent
Hung et al.

(10) Patent No.: US 10,177,180 B2
(45) Date of Patent: Jan. 8, 2019

(54) METHOD FOR FORMING PIXEL STRUCTURE

(71) Applicant: CHUNGHWA PICTURE TUBES, LTD., Taoyuan (TW)

(72) Inventors: Shu-Kai Hung, Taipei (TW); Chia-Ming Chiang, Taoyuan (TW)

(73) Assignee: CHUNGHWA PICTURE TUBES, LTD., Taoyuan (TW)

( * ) Notice: Subject to any disclaimer, the term of this patent is extended or adjusted under 35 U.S.C. 154(b) by 0 days.

(21) Appl. No.: 15/650,984

(22) Filed: Jul. 17, 2017

(65) Prior Publication Data

US 2018/0323224 A1 Nov. 8, 2018

(30) Foreign Application Priority Data

May 8, 2017 (CN) .......................... 2017 1 0317052

(51) Int. Cl.
*H01L 27/12* (2006.01)
*G02F 1/1343* (2006.01)

(52) U.S. Cl.
CPC .... *H01L 27/1288* (2013.01); *G02F 1/134309* (2013.01); *H01L 27/124* (2013.01); *G02F 2001/134318* (2013.01)

(58) Field of Classification Search
CPC ............ H01L 27/1214; H01L 27/1251; H01L 27/3244–27/3297; H01L 29/4908; H01L 51/0508–51/0533; H01L 2924/13069; H01L 29/41733; H01L 29/42384; H01L 29/66265; H01L 29/66742–29/6675; H01L 29/7317; H01L 29/786
See application file for complete search history.

(56) References Cited

U.S. PATENT DOCUMENTS

| | | | |
|---|---|---|---|
| 2008/0012017 A1* | 1/2008 | Jung | G02F 1/136286 257/59 |
| 2009/0081820 A1* | 3/2009 | Park | G02F 1/13458 438/34 |
| 2016/0043116 A1 | 2/2016 | Sun et al. | |

FOREIGN PATENT DOCUMENTS

| | | |
|---|---|---|
| TW | 201418855 A | 5/2014 |
| TW | 201543648 A | 11/2015 |

\* cited by examiner

*Primary Examiner* — Cuong B Nguyen
(74) *Attorney, Agent, or Firm* — CKC & Partners Co., Ltd.

(57) ABSTRACT

A method for forming a pixel structure is provided. The method includes: forming a gate electrode layer on a substrate; forming a first insulating layer on the gate electrode layer and the substrate; forming a semiconductor layer on the first insulating layer; forming a pixel electrode layer on the first insulating layer and the semiconductor layer; forming a source/drain electrode layer on the pixel electrode layer, the semiconductor layer, and the first insulating layer; forming a second insulating layer on the semiconductor layer, the pixel electrode layer, the source/drain electrode layer, and the first insulating layer; and forming a common electrode layer on the second insulating layer, in which an orthogonal projection of the semiconductor layer on the substrate is complementary to an orthogonal projection of the common electrode layer on the substrate.

10 Claims, 10 Drawing Sheets

METHOD FOR FORMING PIXEL STRUCTURE

RELATED APPLICATIONS

This application claims priority to China Application Serial Number 201710317052.5, filed May 8, 2017, which are herein incorporated by reference.

BACKGROUND

Technical Field

The present disclosure relates to a method for forming a pixel structure.

Description of Related Art

A liquid crystal display (LCD) is a flat and thin panel displaying device that is made up of a certain number of pixels arrayed in front of a light source or a reflector to produce images in color or monochrome. The LCD is more energy efficient and safer and thus has become the mainstream in the market.

To further improve the LCD, persons in the industry have made every endeavor to discover new solutions. Specifically, six masks are needed in general LCD manufacturing processes. How to reduce the number of the mask needed in the manufacturing processes to reduce the time needed for new product development have become one of the most important research topics.

SUMMARY

This disclosure provides a method for forming a pixel structure to effectively reduce the design and manufacturing costs and meanwhile make the design become easier.

In one aspect of the disclosure, a method for forming a pixel structure is provided. The method includes: forming a gate electrode layer on a substrate; forming a first insulating layer on the gate electrode layer and the substrate; forming a semiconductor layer on the first insulating layer; forming a pixel electrode layer on the first insulating layer and the semiconductor layer; forming a source/drain electrode layer on the pixel electrode layer, the semiconductor layer, and the first insulating layer; forming a second insulating layer on the semiconductor layer, the pixel electrode layer, the source/drain electrode layer, and the first insulating layer; and forming a common electrode layer on the second insulating layer, in which an orthogonal projection of the semiconductor layer on the substrate is complementary to an orthogonal projection of the common electrode layer on the substrate.

In one or more embodiments, the step of forming the semiconductor layer further includes: forming the semiconductor layer on the first insulating layer; coating a first photoresist layer on the semiconductor layer; exposing and developing the first photoresist layer to form a first photoresist pattern; etching and patterning the semiconductor layer with the first photoresist pattern as a mask; and removing the first photoresist layer.

In one or more embodiments, the step of forming the common electrode layer further includes: forming the common electrode layer on the second insulating layer; coating a second photoresist layer on the common electrode layer; exposing and developing the second photoresist layer to form a second photoresist pattern; etching and patterning the common electrode layer with the second photoresist pattern as a mask; and removing the second photoresist layer.

In one or more embodiments, the step of exposing and developing the first photoresist layer and the step of exposing and developing the second photoresist layer use a mask with the same pattern.

In one or more embodiments, the mask has an opening pattern, and a shape of the opening pattern corresponds to a shape of the patterned semiconductor layer.

In one or more embodiments, the mask has an opening pattern, and a shape of the opening pattern corresponds to a shape of the patterned common electrode layer.

In one or more embodiments, the first photoresist layer is a positive photoresist, and the second photoresist layer is a negative photoresist.

In one or more embodiments, the first photoresist layer is a negative photoresist, and the second photoresist layer is a positive photoresist.

In one or more embodiments, the step of forming the pixel electrode layer includes forming at least one part of the pixel electrode layer directly contacting the semiconductor layer.

In one or more embodiments, the step of forming the common electrode layer includes forming an opening in the common electrode layer, in which an orthogonal projection of the opening on the substrate at least partially overlaps with an orthogonal projection of the source/drain electrode layer on the substrate.

The step of patterning the semiconductor layer and the step of patterning the common electrode layer use a mask with the same pattern. Therefore, the time for the new product development can be reduced and the design will become easier.

DETAILED DESCRIPTION

FIG. 1 to FIG. 5 are schematic top views of intermediate manufacturing steps in a method for forming a pixel structure 100 according to one embodiment of this disclosure. A method for forming a pixel structure 100 is provided. By using the method, the number of the masks need in the overall manufacturing steps can be reduced, such that the cost of the design and the manufacture is effectively reduced and meanwhile the design becomes easier.

Figure 1:
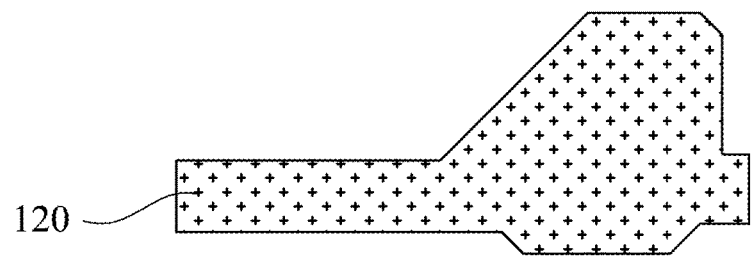
FIG. 1 to FIG. 5 are schematic top views of intermediate manufacturing steps in a method for forming a pixel structure according to one embodiment of this disclosure.
Figure 7:
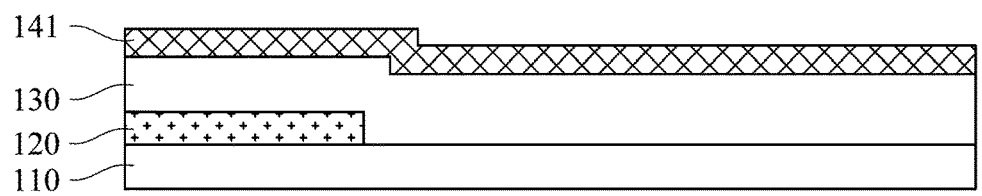
FIG. 7 to FIG. 11 are schematic cross-sectional views of detailed manufacturing steps of forming the semiconductor layer viewed along line A-A of FIG. 2.

As shown in FIG. 1, a gate electrode layer 120 is formed on a substrate 110 (see FIG. 7). Specifically, the manufacturer can first form a conductive layer on the substrate 110 and then pattern the conductive layer to form the gate electrode layer 120.

In this embodiment, the substrate 110 may be made of glass or other transparent materials. The gate electrode layer 120 may be made of titanium, molybdenum, chromium, iridium, aluminum, copper, silver, gold, or any combination or alloy thereof. The conductive layer may be formed by physical vapor deposition, such as sputtering. The conductive layer may be patterned by, for example, lithography and etching.

Then, a first insulating layer 130 (see FIG. 7) is formed on the gate electrode layer 120 and the substrate 110.

Specifically, the first insulating layer 130 may be made of any dielectric material such as silicon nitride, silicon oxide, silicon oxynitride, or any combination thereof. The first insulating layer 130 may be formed by, for example, chemical vapor deposition.

Figure 2:
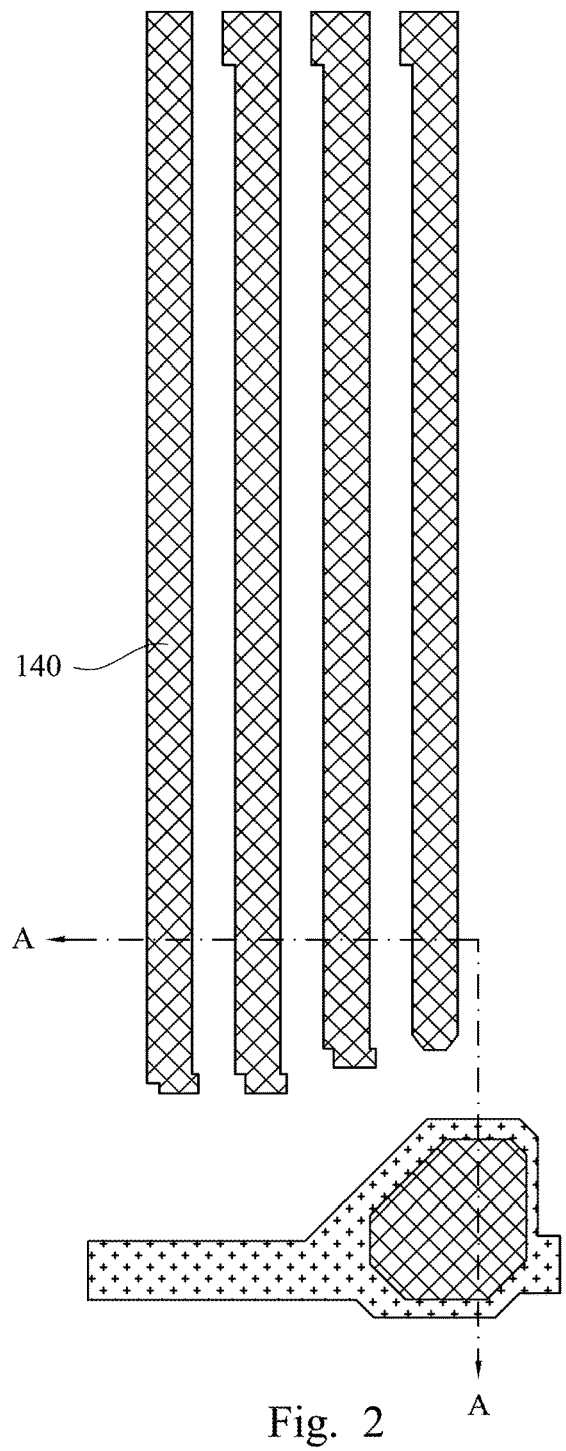

As shown in FIG. 2, a semiconductor layer 140 is formed on the first insulating layer 130 (see FIG. 7). Specifically, the manufacturer can first form a semiconductor layer on the first insulating layer 130 and then pattern the semiconductor layer to form the patterned semiconductor layer 140.

The semiconductor layer 140 may be made of any semiconductor material such as amorphous silicon, polycrystalline silicon, monocrystalline silicon, oxide semiconductor, or any combination thereof. The semiconductor layer may be formed by, for example, chemical vapor deposition. The semiconductor layer 140 may be patterned by, for example, lithography and etching.

Figure 6:
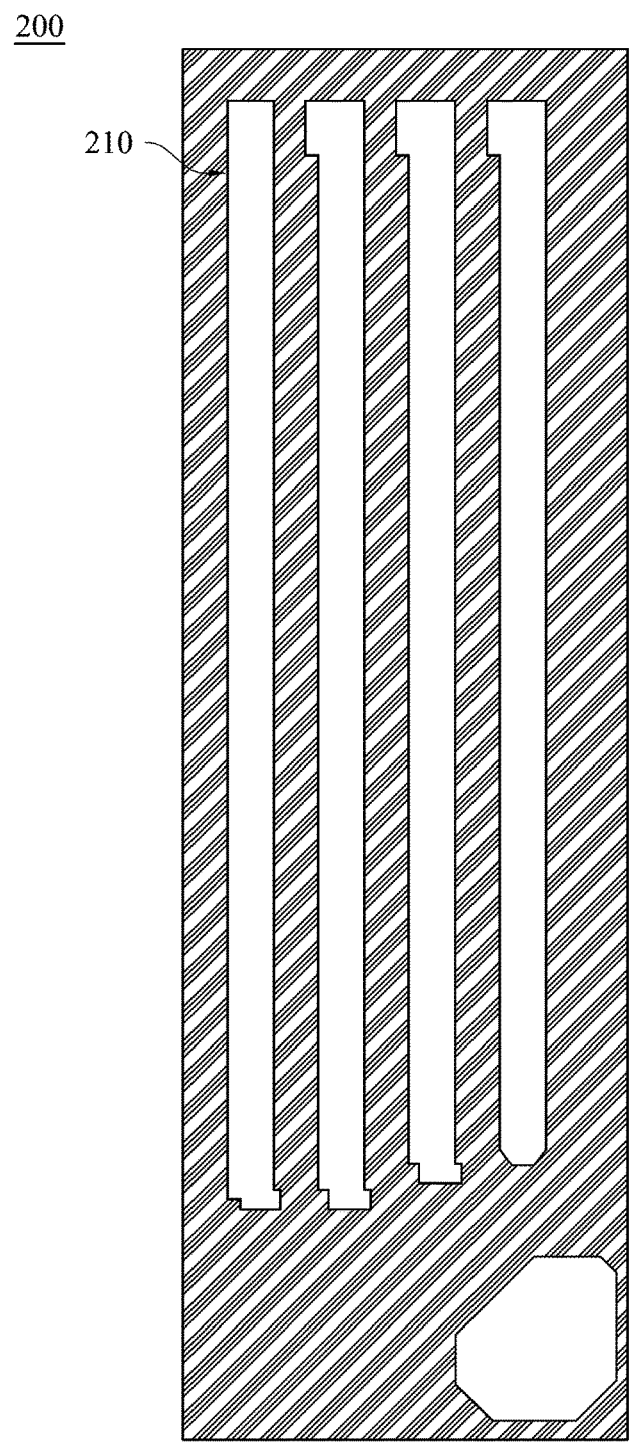
FIG. 6 is a schematic top view of a mask used in the step of patterning the semiconductor layer according to one embodiment of this disclosure.

FIG. 6 is a schematic top view of a mask 200 used in the step of patterning the semiconductor layer according to one embodiment of this disclosure. As shown in FIG. 6, specifically, a mask 200 is used in the step of patterning the semiconductor layer. In a subsequent step of patterning a common electrode layer, the mask 200 or another mask the same as the mask 200 will be used as well. Because the same mask 200 is used in two different steps, the time required to design this mask 200 will be reduced, thus reducing the time needed for new product development and making the design easier.

Further, as shown in FIG. 2 and FIG. 6, the mask 200 has an opening pattern 210, and the shape of the opening pattern 210 corresponds to the shape of the patterned semiconductor layer 140. It is noted that the shape of the mask 200 is only illustrative. The actual shape of the mask 200 is not necessarily the same as the shape shown in FIG. 6.

Figure 8:
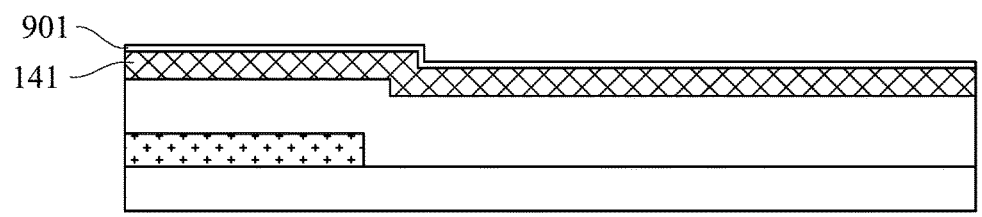
Figure 9:
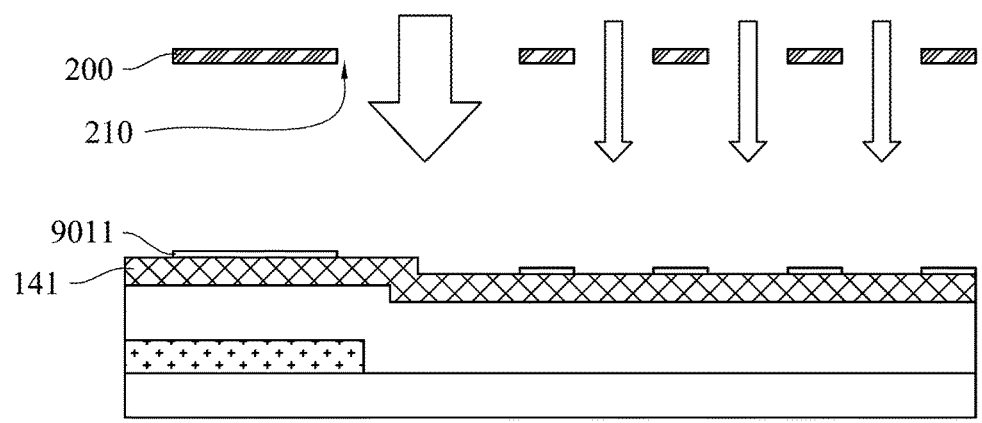
Figure 10:
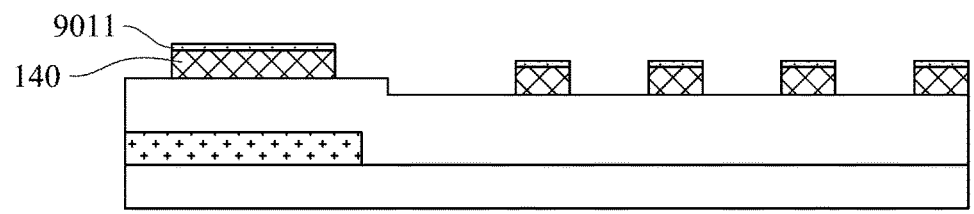
Figure 11:
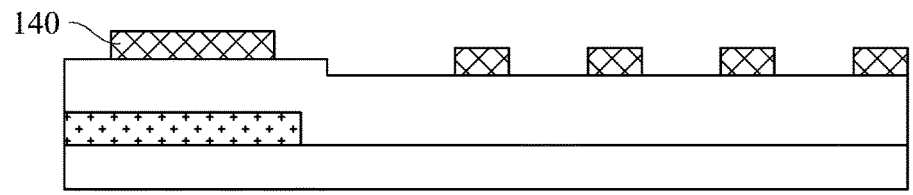

FIG. 7 to FIG. 11 are schematic cross-sectional views of detailed manufacturing steps of forming the semiconductor layer 140 viewed along line A-A of FIG. 2. As shown in FIG. 7, a semiconductor layer 141 is formed on the first insulating layer 130. Then, as shown in FIG. 8, a first photoresist layer 901 is coated on the semiconductor layer 141. Then, as shown in FIG. 9, the first photoresist layer is exposed via mask 200 and developed to form a first photoresist pattern 9011. Then, as shown in FIG. 10, the semiconductor layer 141 is etched and patterned with the first photoresist pattern 9011 as a mask to form the semiconductor layer 140. Finally, as shown in FIG. 11, the first photoresist layer 901 is removed.

In this embodiment, the first photoresist layer 901 is a positive photoresist. Embodiments of this disclosure are not limited thereto. In other embodiments, the first photoresist layer 901 may be a negative photoresist.

Figure 3:
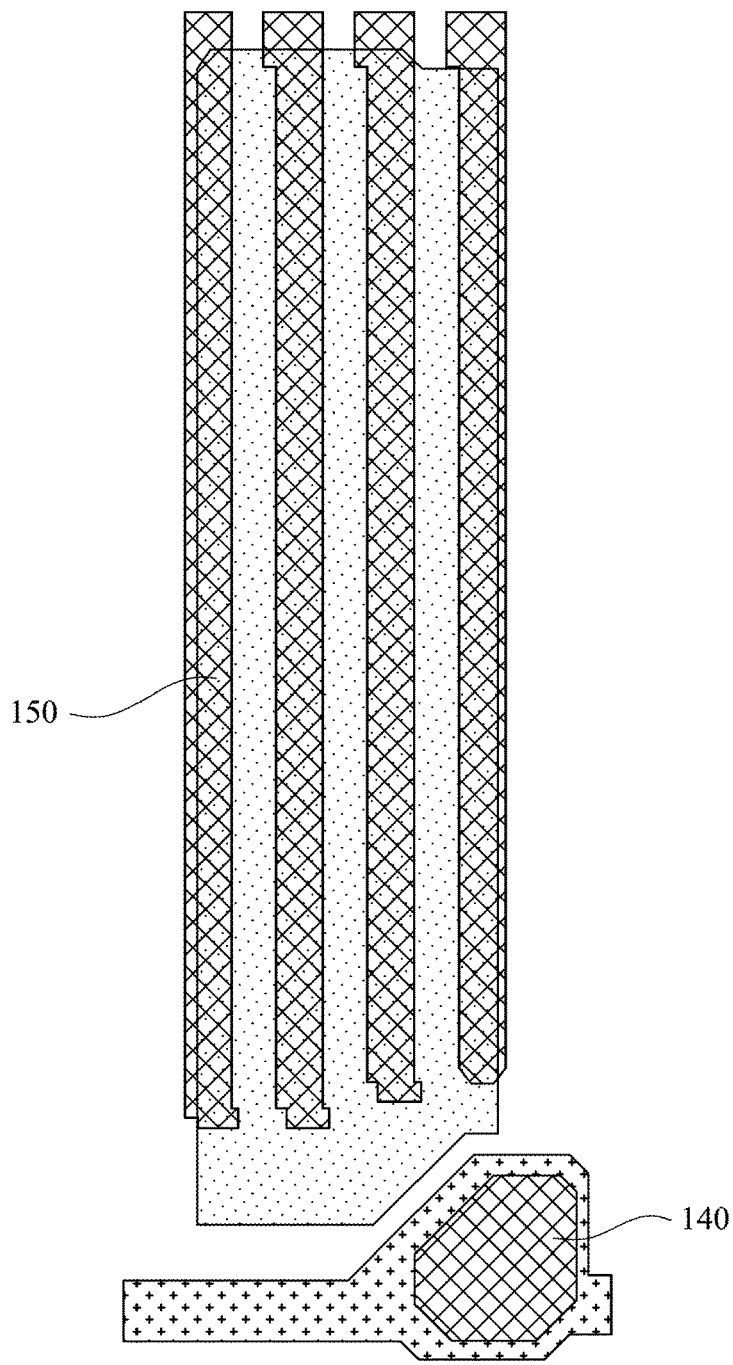

As shown in FIG. 3, a pixel electrode layer 150 is formed on the first insulating layer 130 (see FIG. 7) and the semiconductor layer 140. Therefore, at least a part of the pixel electrode layer 150 directly contacts the semiconductor layer 140. Specifically, the manufacturer can first deposit a conductive layer (not shown in Figs.) on the first insulating layer 130 and the semiconductor layer 140 and then pattern the conductive layer to form the patterned pixel electrode layer 150.

In this embodiment, the pixel electrode layer 150 may be made of any transparent conductive material. For example, indium tin oxide, indium zinc oxide, zinc oxide, other conductive oxides, or any combination thereof. The conductive layer may be formed by, for example, physical vapor deposition or chemical vapor deposition. The conductive layer may be patterned by, for example, lithography and etching.

Figure 4:
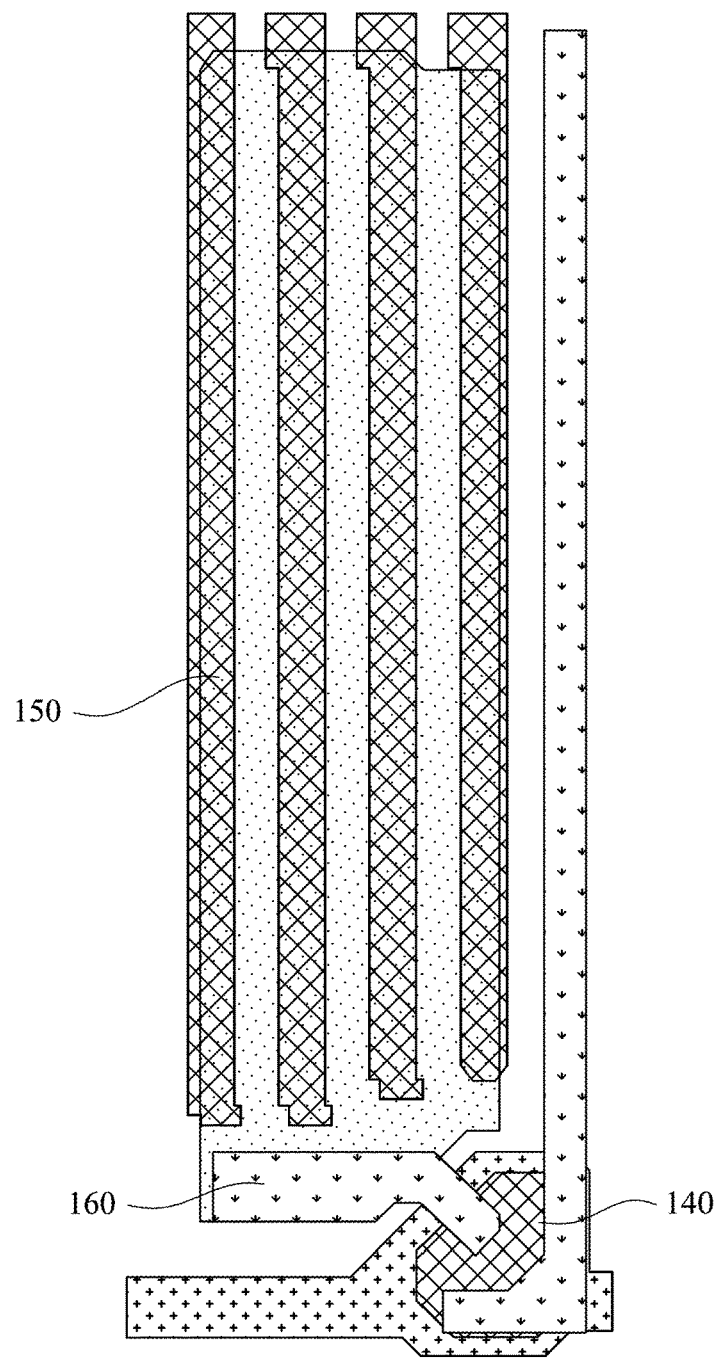

As shown in FIG. 4, a source/drain electrode layer 160 is formed on the pixel electrode layer 150, the semiconductor layer 140, and the first insulating layer 130 (see FIG. 7). Specifically, the manufacturer can first deposit a conductive layer (not shown in Figs.) on the pixel electrode layer 150, the semiconductor layer 140, and the first insulating layer 130 (see FIG. 7) and then pattern the conductive layer to form the source/drain electrode layer 160.

In this embodiment, the source/drain electrode layer 160 may be made of titanium, molybdenum, chromium, iridium, aluminum, copper, silver, gold, or any combination or alloy thereof. The conductive layer may be formed by physical vapor deposition, such as a sputtering. The conductive layer may be patterned by, for example, lithography and etching.

Figure 12:
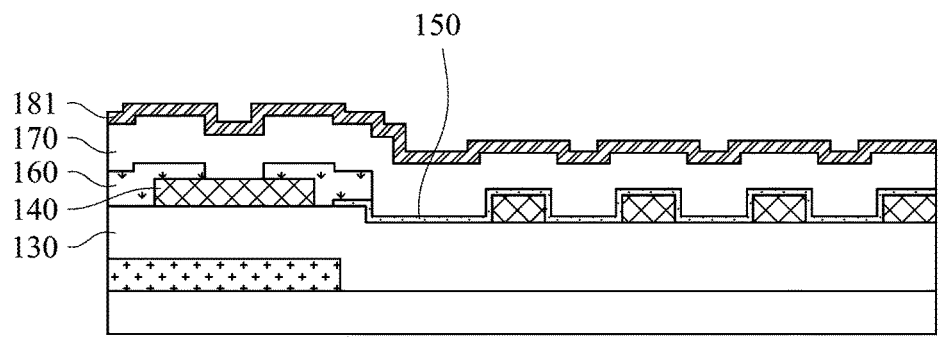
FIG. 12 to FIG. 16 are schematic cross-sectional views of detailed manufacturing steps of forming the common electrode layer viewed along line B-B of FIG. 5.

Then, a second insulating layer 170 (see FIG. 12) is formed on the semiconductor layer 140, the pixel electrode layer 150, the source/drain electrode layer 160, and the first insulating layer 130 (see FIG. 12).

Specifically, the second insulating layer 170 may be made of any dielectric material, such as silicon nitride, silicon oxide, silicon oxynitride, or any combination thereof. The second insulating layer 170 may be formed by, for example, chemical vapor deposition.

Figure 5:
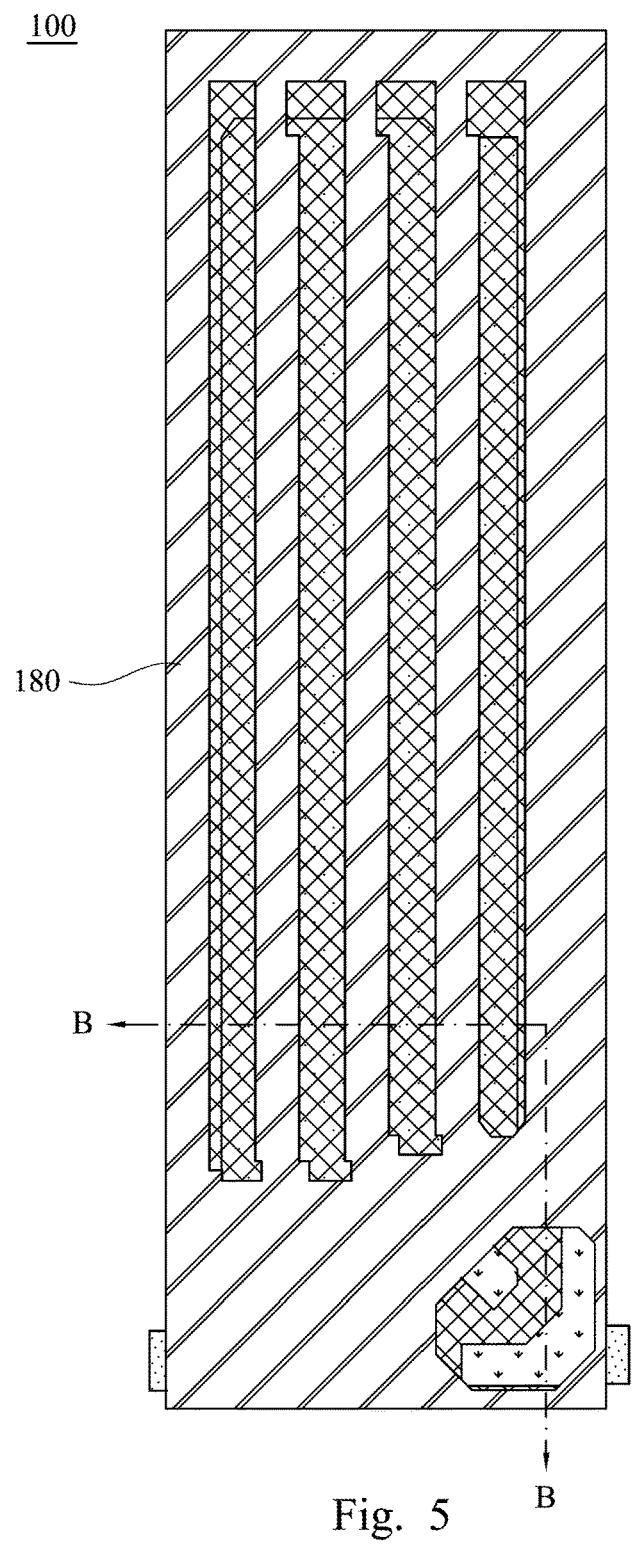
Figure 16:
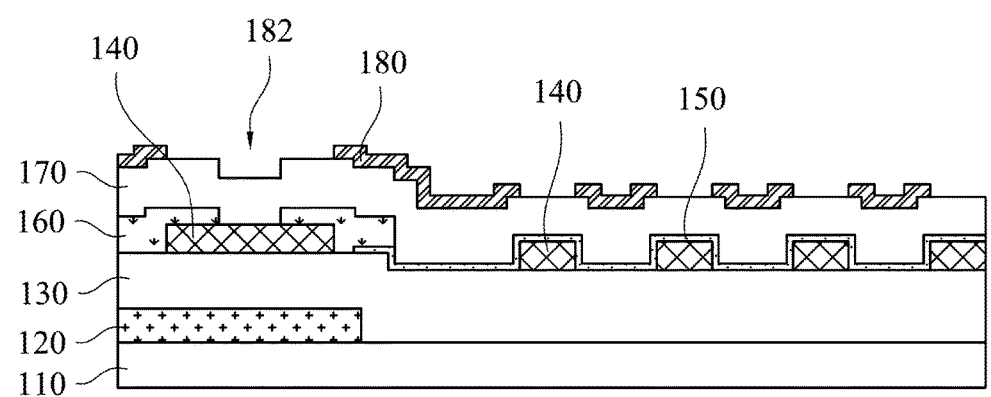

As shown in FIG. 5, a common electrode layer 180 is formed on the second insulating layer 170 (see FIG. 16). Specifically, the manufacturer can first deposit a conductive layer 181 and then pattern the conductive layer 181 to form the patterned common electrode layer 180.

In this embodiment, the common electrode layer 180 may be made of any transparent conductive material such as indium tin oxide, indium zinc oxide, zinc oxide, other conductive oxides, or any combination thereof. The conductive layer may be formed by, for example, physical vapor deposition or chemical vapor deposition. The conductive layer may be patterned by, for example, lithography and etching.

Specifically, as shown in FIG. 6, the step of patterning the common electrode layer uses the mask 200. Because the step of patterning the semiconductor layer uses the mask 200 as well, two steps use the same mask. Therefore, the time needed to design the mask will be reduced, such that the time for the new product development can be reduced and the design will become easier.

Figure 13:
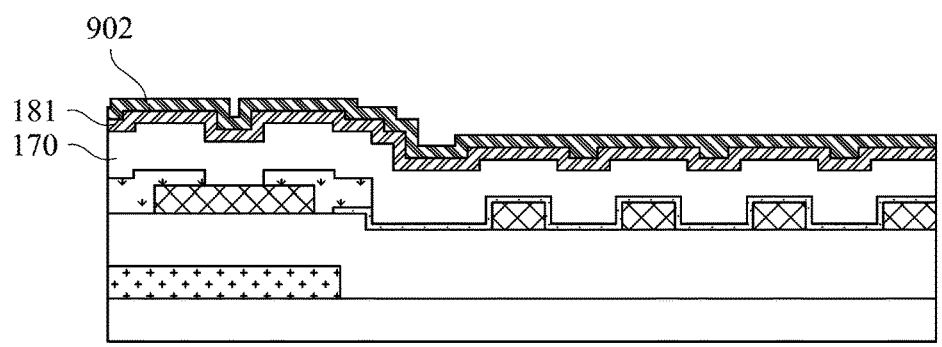
Figure 14:
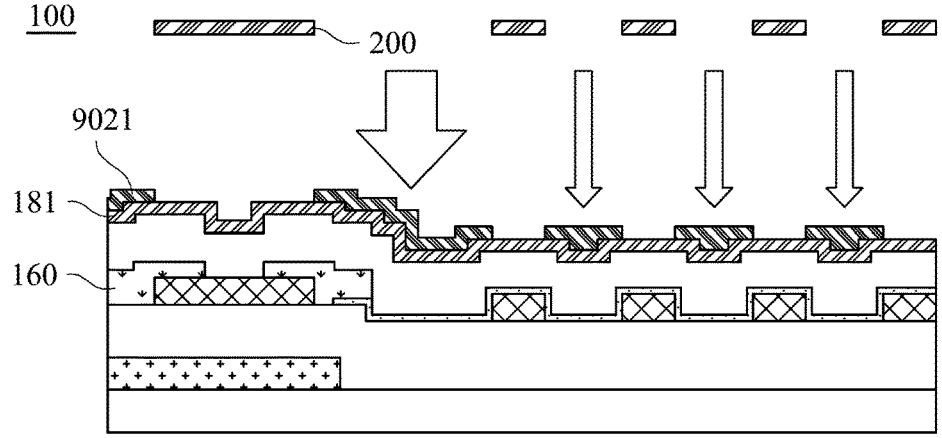
Figure 15:
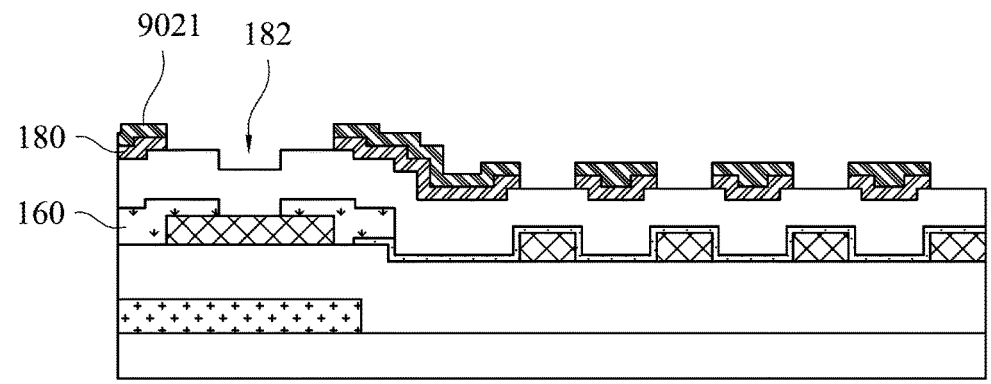

FIG. 12 to FIG. 16 are schematic cross-sectional views of detailed manufacturing steps of forming the common electrode layer 180 viewed along line B-B of FIG. 5. First, as shown in FIG. 12, the conductive layer 181 (or the common electrode layer) is formed on the second insulating layer 170. Then, as shown in FIG. 13, a second photoresist layer 902 is coated on the conductive layer 181 (or the common electrode layer). Then, as shown in FIG. 14, the second photoresist layer 902 is exposed and developed to form a second photoresist pattern 9021. In this step, the mask 200 or another mask with the same pattern is used to perform the exposure and development (therefore, the step of exposing and developing the second photoresist layer 902 use the same mask or another mask with the same pattern with that used in the step of exposing and developing the first photoresist layer 901 to form the second photoresist pattern 9021). Then, as shown in FIG. 15, the conductive layer 181 (or the common electrode layer) is etched and patterned with the second photoresist pattern 9021 as a mask to form the common electrode layer 180. Finally, as shown in FIG. 16, the second photoresist pattern 9021 is removed.

In this embodiment, the second photoresist layer 902 is a negative photoresist. Embodiments of this disclosure are not limited thereto. In other embodiments, the second photoresist layer 902 may be a positive photoresist.

It is noted that because the step of exposing and developing the first photoresist layer 901 and the step of exposing and developing the second photoresist layer 902 use the same mask, the first photoresist layer 901 is a positive photoresist, and the second photoresist layer 902 is a negative photoresist, the orthogonal projection of the semiconductor layer 140 on the substrate 110 is complementary to the orthogonal projection of the common electrode layer 180 on the substrate 110.

As shown in FIG. 16, in the pixel structure 100, at least one part of the semiconductor layer 140 directly contacts the pixel electrode layer 150. The part of the semiconductor layer 140 will not affect the aperture ratio of the pixel structure 100, nor does it cause electrical problems such as parasitic capacitance.

Further, in the step of forming the common electrode layer 180, an opening 182 is formed in the common electrode layer 180, in which the orthogonal projection of the opening 182 on the substrate 110 at least partially overlaps with the orthogonal projection of the source/drain electrode layer 160 on the substrate 110. The opening 182 will not affect the aperture ratio of the pixel structure 100, nor does it cause electrical problems such as parasitic capacitance.

In other embodiments, the mask used in the step of exposing and developing the first photoresist layer 901 and the step of exposing and developing the second photoresist layer 902 has an opening pattern, and the shape of the opening pattern corresponds to the shape of the patterned common electrode layer 180 (i.e., the shape of the mask is basically complementary to the mask 200). At the same time, the first photoresist layer 901 is a negative photoresist, and the second photoresist layer 902 is a positive photoresist. Therefore, all structure of the pixel structure 100 is basically the same with the aforementioned embodiments, and the orthogonal projection of the semiconductor layer 140 on the substrate 110 is complementary to the orthogonal projection of the common electrode layer 180 on the substrate 110.

Further, because the pattern of the common electrode layer 180 has a smaller linewidth, and using positive photoresist usually has a higher resolution. Therefore, when the second photoresist layer 902 is a positive photoresist, the pattern resolution of the common electrode layer 180 can be further enhanced.

The step of patterning the semiconductor layer 140 and the step of patterning the common electrode layer 180 use a mask with the same pattern. Therefore, the time for the new product development can be reduced and the design will become easier.

What is claimed is:

1. A method for forming a pixel structure, comprising the following steps:
    forming a gate electrode layer on a substrate;
    forming a first insulating layer on the gate electrode layer and the substrate;
    forming a semiconductor layer on the first insulating layer;
    forming a pixel electrode layer on the first insulating layer and the semiconductor layer;
    forming a source/drain electrode layer on the pixel electrode layer, the semiconductor layer, and the first insulating layer;
    forming a second insulating layer on the semiconductor layer, the pixel electrode layer, the source/drain electrode layer, and the first insulating layer; and
    forming a common electrode layer having an opening on the second insulating layer, wherein a pattern of the opening substantially corresponds to and is substantially the same as a pattern of the semiconductor layer.

2. The method of claim 1, wherein the step of forming the semiconductor layer further comprises:
    forming the semiconductor layer on the first insulating layer;
    coating a first photoresist layer on the semiconductor layer;
    exposing and developing the first photoresist layer to form a first photoresist pattern;
    etching and patterning the semiconductor layer with the first photoresist pattern as a mask; and
    removing the first photoresist layer.

3. The method of claim 2, wherein the step of forming the common electrode layer further comprises:
    forming the common electrode layer on the second insulating layer;
    coating a second photoresist layer on the common electrode layer;
    exposing and developing the second photoresist layer to form a second photoresist pattern;
    etching and patterning the common electrode layer with the second photoresist pattern as a mask; and
    removing the second photoresist layer.

4. The method of claim 3, wherein the step of exposing and developing the first photoresist layer and the step of exposing and developing the second photoresist layer use a mask with the same pattern.

5. The method of claim 4, wherein the mask has an opening pattern, and a shape of the opening pattern corresponds to a shape of the patterned semiconductor layer.

6. The method of claim 4, wherein the mask has an opening pattern, and a shape of the opening pattern corresponds to a shape of the patterned common electrode layer.

7. The method of claim 3, wherein the first photoresist layer is a positive photoresist, and the second photoresist layer is a negative photoresist.

8. The method of claim 3, wherein the first photoresist layer is a negative photoresist, and the second photoresist layer is a positive photoresist.

9. The method of claim 1, wherein the step of forming the pixel electrode layer comprises forming at least one part of the pixel electrode layer directly contacting the semiconductor layer.

10. The method of claim 1, wherein the step of forming the common electrode layer comprises forming an opening in the common electrode layer, wherein an orthogonal projection of the opening on the substrate at least partially overlaps with an orthogonal projection of the source/drain electrode layer on the substrate.

* * * * *